United States Patent
Hale et al.

(10) Patent No.: US 7,236,338 B2
(45) Date of Patent: *Jun. 26, 2007

(54) SYSTEM AND METHOD FOR REMOTELY DETECTING AND LOCATING FAULTS IN A POWER SYSTEM

(75) Inventors: Christopher L. Hale, Harvest, AL (US); Rodney M. Hornsby, Madison, AL (US); John M. Maxwell, Jr., Eva, AL (US); Charles R. Schwarz, Huntsville, AL (US)

(73) Assignee: The Boeing Company, Chicago, IL (US)

( * ) Notice: Subject to any disclaimer, the term of this patent is extended or adjusted under 35 U.S.C. 154(b) by 631 days.

This patent is subject to a terminal disclaimer.

(21) Appl. No.: 10/663,584

(22) Filed: Sep. 16, 2003

(65) Prior Publication Data

US 2005/0057869 A1    Mar. 17, 2005

(51) Int. Cl.
*H02H 3/00* (2006.01)
(52) U.S. Cl. ................. 361/42; 361/62; 361/93.1
(58) Field of Classification Search ............ 361/93.1, 361/42, 62
See application file for complete search history.

(56) References Cited

U.S. PATENT DOCUMENTS

| | | | |
|---|---|---|---|
| 3,327,170 A * | 6/1967 | Sonnemann | 361/63 |
| 4,556,882 A | 12/1985 | Brifman et al. | 340/3.44 |
| 4,884,034 A * | 11/1989 | Guzman | 324/529 |
| 5,479,610 A | 12/1995 | Roll-Mecak et al. | 714/25 |
| 5,514,965 A | 5/1996 | Westwood | 324/533 |
| 5,606,482 A | 2/1997 | Witmer | 361/93.7 |
| 5,631,545 A | 5/1997 | Norman et al. | 323/205 |
| 5,717,337 A | 2/1998 | Kelly | 324/533 |
| 5,726,843 A | 3/1998 | Arita et al. | 361/5 |

(Continued)

FOREIGN PATENT DOCUMENTS

DE    3121409 A1    12/1982

OTHER PUBLICATIONS

John M. Maxwell, Jr., John H. Blumer, Blake Burden; *A Configurable Solid State Power Management and Distribution System*; 7 pages; Society of Automotive Engineers, Inc.; 2002-01-3210.

(Continued)

*Primary Examiner*—Stephen W. Jackson
(74) *Attorney, Agent, or Firm*—Alston & Bird LLP

(57) ABSTRACT

A system and method are provided for remotely detecting and locating faults in a power system. The system includes at least one slave controller and at least one supplemental protection module. The slave controller is disposed proximate at least one load and electrically connected to the loads via at least one conductor. More particularly, the slave controller includes at least one solid-state switch capable of controllably altering the input current to the loads. The slave controller also includes at least one measuring element for measuring at least one parameter associated with the loads and the solid-state switches. The solid-state switch can then controllably alter the input current to the loads according to the parameter. The supplemental protection modules are electrically connected to the conductors between the slave controller and the loads. In this regard, the supplemental protection modules can detects at least one fault in at least one conductor.

26 Claims, 12 Drawing Sheets

U.S. PATENT DOCUMENTS

| 6,127,882 A | 10/2000 | Vargha et al. | 327/540 |
| 6,377,031 B1 | 4/2002 | Karuppana et al. | 323/220 |
| 6,943,558 B2 * | 9/2005 | Hale et al. | 324/536 |

OTHER PUBLICATIONS

Tidal Wave of Wiring Requirements to Hit Industry; *Air Safety Week*; Jul. 15, 2002, Washington, DC; 10 pages; vol. 16, No. 27; PBI Media.

New Technology Enhances Electrical System Safety; *Air Safety Week*; Sep. 16, 2002, Washington DC; 10 pages; vol. 16, No. 35; PBI Media.

*TDR—Time Domain Reflectometry Analysis*; Granite Island Group—Technical Surveillance Counter Measures; 6 pages; *available at* <http://www.tscm.com/tdr.html> (visited Nov. 11, 2002).

*Ground Fault Interrupter*; 5 pages; *available at* <http://hyperphysics.phy-astr.gsu.edu/hbase/electric/gfi2.html> (visited Nov. 25, 2002).

*TDR Tutorial—Introduction to Time Domain Reflectometry—An Introduction to Time Domain Reflectometers*; Granite Island Group—Technical Surveillance Counter Measures; 10 pages; available at <http://www.tscm.com/riprcop.html> (visited Nov. 26, 2002).

\* cited by examiner

SYSTEM AND METHOD FOR REMOTELY DETECTING AND LOCATING FAULTS IN A POWER SYSTEM

FIELD OF THE INVENTION

The present invention relates generally to power system maintenance and, more particularly, to a system and method for remotely detecting and locating faults in a power system.

BACKGROUND OF THE INVENTION

In many industries today, such as the avionics and automotive industries, complex and costly electrical components, systems and subsystems, as well as the electrical power systems powering these components, are interconnected by many bundles of conductors, typically wires, with each bundle including a plurality of wires. Although each wire is typically surrounded by insulation, or sheathing, such wires can become faulty. In this regard, as the wires age, the insulation can breakdown and chaff. In such instances, the wires can contact other wires or other conductive structures, such as framework. Also, strands in aging wires can begin to separate and tear due to vibration, shock and stress on the wires. Stress due to pinching, rubbing, moisture, corrosion, excessive heat and/or lightening strikes also pose risks that can lead to wire damage. Further, tight fitting connection points within connectors can loosen over time when subjected to the same environmental conditions as the conductors, and when subjected to numerous connects and disconnects due to replacement and maintenance of the electrical components, systems, subsystems, and the electrical power systems.

As will be appreciated by those skilled in the art, when the insulation surrounding the wires breaks down or chaffs, or the wire otherwise becomes faulty, undesirable electric arcs or other wire breakdown can occur at one or more locations along the wires, which can lead to breaks or shorts in the system. It will also be appreciated that in many instances, the location of such arc events or other wire breakdowns can be difficult to find. In this regard, the location of an arc event or other wire breakdown may be inside of a bulkhead or inside of a wire bundle. Also, an arc event may only brown an area of occurrence without actually burning through or burning the insulation away form the affected wire.

In many instances, detecting and locating the arc event or other wire breakdown can be difficult, if not impossible. In this regard, detecting a fault in the system as being caused by a faulty wire may be difficult in systems that also include complex electrical components, systems, subsystems and power systems. As such, misdiagnosing a fault in the system as being caused by costly electrical components, for example, can result in unnecessary replacement of such components while still failing to correct the fault.

In addition to the difficulty in detecting an arc event or other wire breakdown, locating such an arc event or other breakdown is also difficult. In many instances, the location of the arc event or other breakdown may be in a location that is impossible to visually locate without extracting a wire bundle from the system. However, inspection of many feet of wire within a system can be very time consuming, and in some cases, may place maintenance personnel at risk for injury. Also, most conventional wire testing equipment is cumbersome and requires unique training of maintenance personnel as to how to use the equipment. Use of such equipment also requires that one or more wire bundles be disconnected in order to test the wires. Unnecessary removal of equipment can also be very costly and time consuming, however, and can add to the required time to perform maintenance on the system. Further, many times such connection points are not located in easily accessed locations.

SUMMARY OF THE INVENTION

In light of the foregoing background, the present invention provides a system and method of locating faults in a power system. The system and method of embodiments of the present invention are capable of detecting any of a number of different faults including, for example, damaged conductors, arc fault events and short circuits. In this regard, the system and method of embodiments of the present invention are capable of preventing interference to loads during operation by conducting a test on a "dead conductor" before applying power to the load. By pre-testing the wire/ load before power is applied, it is possible to prevent power from being applied to a damaged wire/load and may avert an arc event from occurring. The system and method of embodiments of the present invention may further provide the location of damage in a conductor, such as the location of a suspected arc event. By locating the suspected damage, maintenance personnel may advantageously narrow the search for the damage to a specific location, even internal to a wiring bundle, without having to spend countless hours visually inspecting every wire from one end to the other.

The system and method of embodiments of the present invention may also monitor input current to the loads for abnormal current representative of an arc fault event and/or a short circuit. The system and method of embodiments of the present invention are capable of continuously monitoring current to the loads for an arc fault event and/or short circuit such that, upon detection of such an event, current to the respective loads can be shut off, thereby reducing the likelihood of the arc fault event becoming catastrophic. Once shutoff, then, the system and method of embodiments of the present invention are capable of verifying the arc fault event and/or short circuit, and may also be capable of locating the arc fault event and/or short circuit. In this regard, the arc fault event is typically verified before the system and method of embodiments of the present invention attempt to locate the arc fault event.

According to one aspect of the present invention, a system is provided for remotely detecting and locating faults in a power system. The system includes at least one slave controller and at least one supplemental protection module. The slave controller is disposed proximate at least one load and electrically connected to the loads via at least one conductor. More particularly, the slave controller includes at least one solid-state switch capable of controllably altering the input current to the loads. The slave controller also includes at least one measuring element for measuring at least one parameter, such as at least one current parameter, associated with the loads and the solid-state switches. The solid-state switch can then controllably alter the input current to the loads according to the parameter.

The supplemental protection modules are electrically connected to the conductors between the slave controller and the loads. In this regard, the supplemental protection modules are capable of detecting at least one fault in at least one conductor. Then, when the supplemental protection module detects a fault, the supplemental protection module can notify a respective slave controller such that the solid-state switches of the respective slave controller can alter the input current to the loads. In one embodiment, the solid-state switches can operate in an on mode where the solid-state switches permit a respective load to receive the input current, and/or an off mode where the solid-state switches prevent the respective load from receiving the input current. When the solid-state switches operate in the off mode, the supplemental protection modules are capable of testing the conductors before the solid-state switches are placed in the on mode to thereby detect at least one fault.

The supplemental protection modules can detect a number of different faults in the power system. For example, each supplemental protection module can be capable of detecting at least one damaged conductor. In this regard, the supplemental protection module can detect the damaged conductor by transmitting at least one test pulse along at least one respective conductor and receiving at least one reflection from the respective conductors. Thereafter, the supplemental protection module can compare the reflections to reference data to thereby detect and/or locate at least one damaged conductor. The supplemental protection module can be further capable of detecting at least one damaged conductor by converting the reflected signal to digital data representative of the reflections that can then be compared to reference data, such as previously stored reference data.

Each supplemental protection module can also be capable of determining a length of the conductors based upon at least one transit time between transmission of the test pulses and reception of the respective reflections. Each supplemental protection module can then be capable of comparing the reflections to reference data by comparing the determined lengths to at least one reference length. More particularly, then, at least one damaged conductor can be detected when at least one determined length is shorter than the respective reference length by more than a threshold length. Each supplemental protection module can then be capable of locating the damage as a point on the respective conductor at the determined length.

In addition to, or in lieu of, detecting a damaged conductor, each supplemental protection module can be capable of detecting an electric arc event by detecting white noise and/or chaotic behavior in current through the at least one conductor to the at least one load. In this regard, each supplemental protection module can be capable of detecting white noise by detecting a spectrally dense current through the conductors to the loads. Each supplemental protection module can be further capable of detecting at least one fault comprising at least one abnormal current representative of a short circuit (e.g., a ground fault as opposed to a conductor-to-conductor short circuit), and/or an electric arc event. More particularly as to detecting a short circuit, in various embodiments each conductor comprises a pair of conductors. Each supplemental protection element can then be capable of detecting at least one fault by receiving a measurement representative of a current difference in the pair of conductors, and thereafter comparing the measurement to a predefined threshold. In this regard, the supplemental protection element is capable of detecting an abnormal current representative of a short circuit when the measurement is greater than the predefined threshold.

When the supplemental protection module detects an electric arc event and/or a short circuit, the supplemental protection module can notify a respective slave controller such that the solid-state switches of the respective slave controller can alter the input current to the loads to prevent the respective loads from receiving the input current. Also, when the respective slave controller alters the input current to prevent the respective load from receiving the input current, the respective supplemental protection module can verify the electric arc event and/or locate the electric arc event on the respective conductor. In this regard, the respective supplemental protection module is typically capable of verifying the electric arc while the electric arc is present, if the supplemental protection module has detected an electric arc.

A method of remotely detecting at least one fault in a power system is also provided.

BRIEF DESCRIPTION OF THE DRAWINGS

Figure 1:
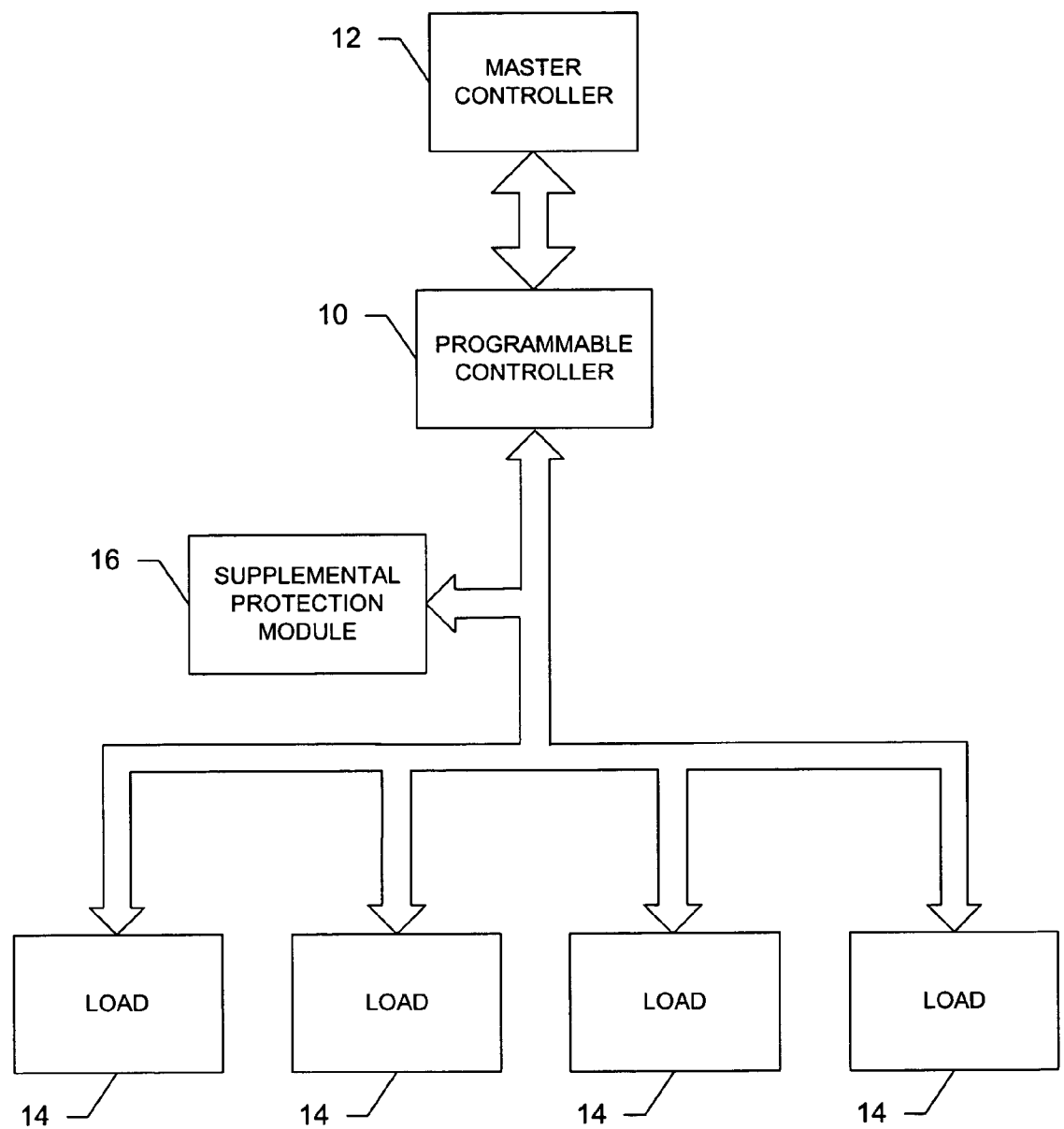
Figure 2:
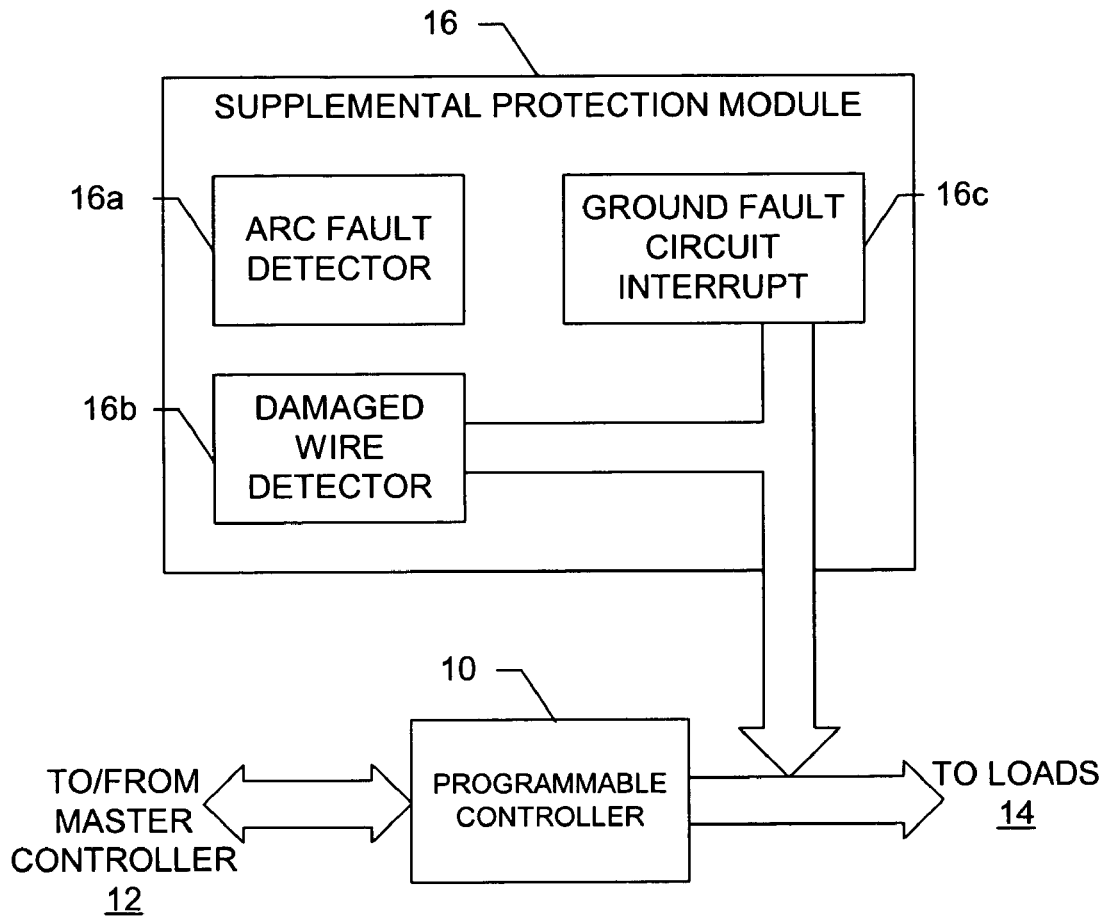
Figure 3:
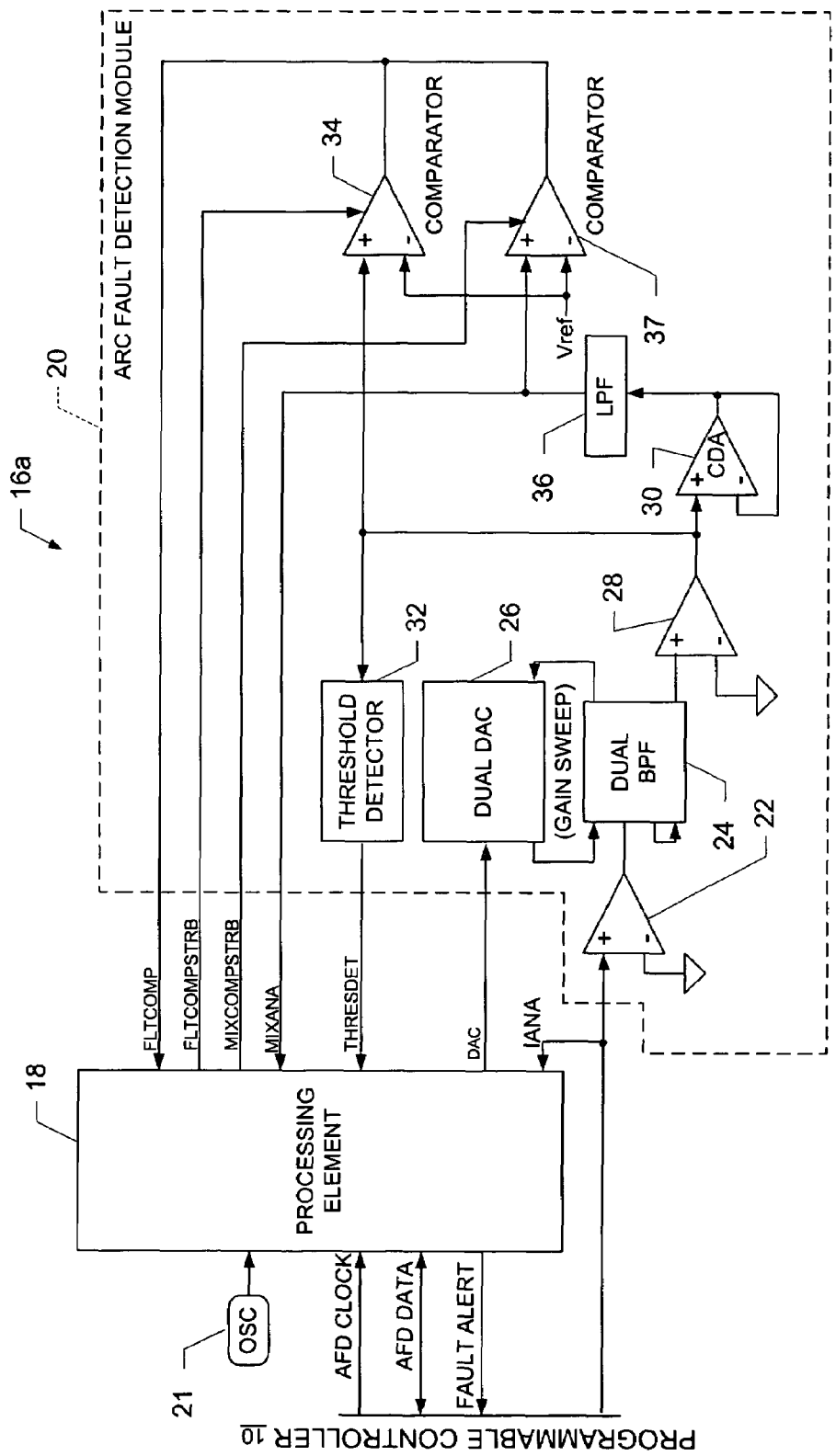
Figure 4:
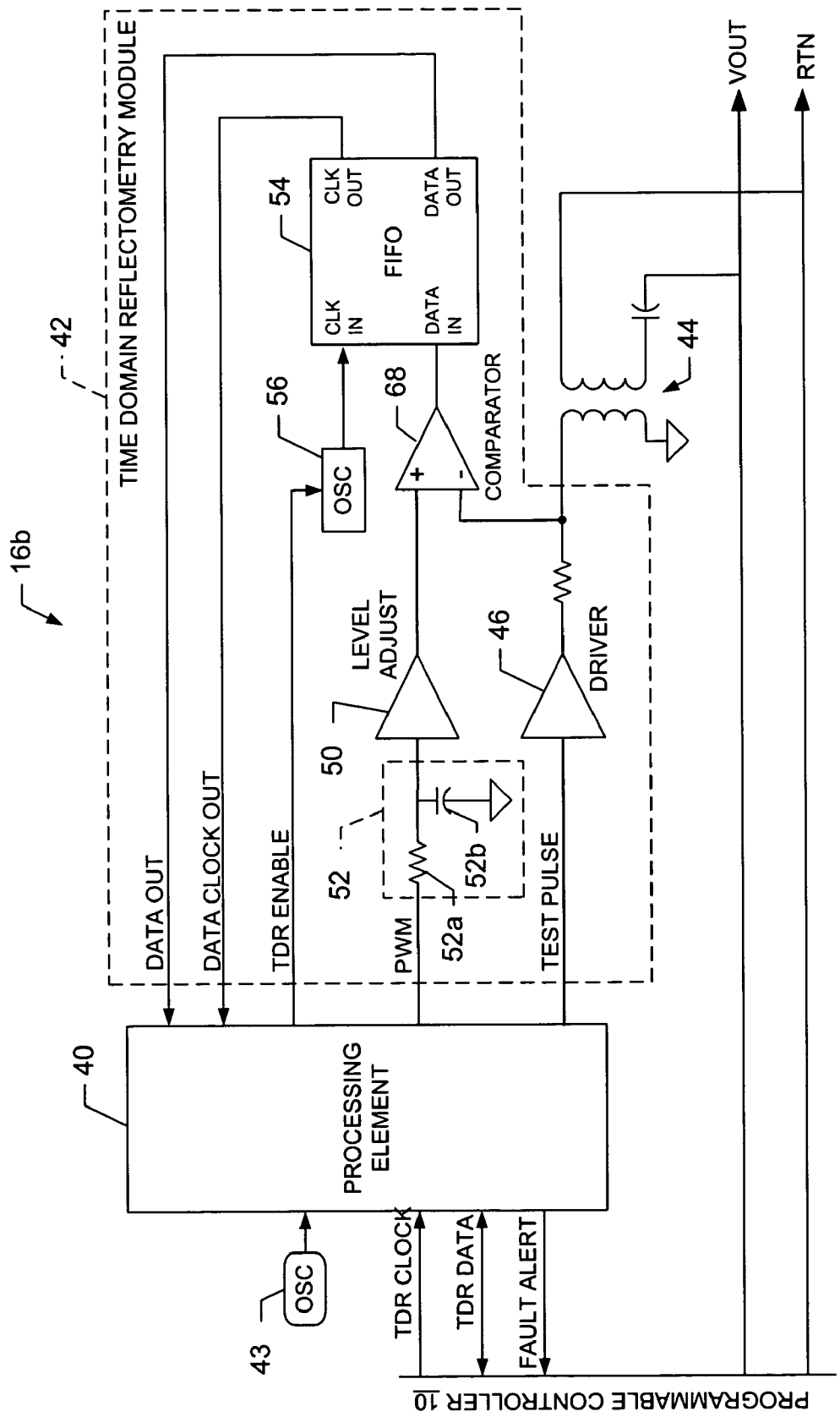
Figure 5:
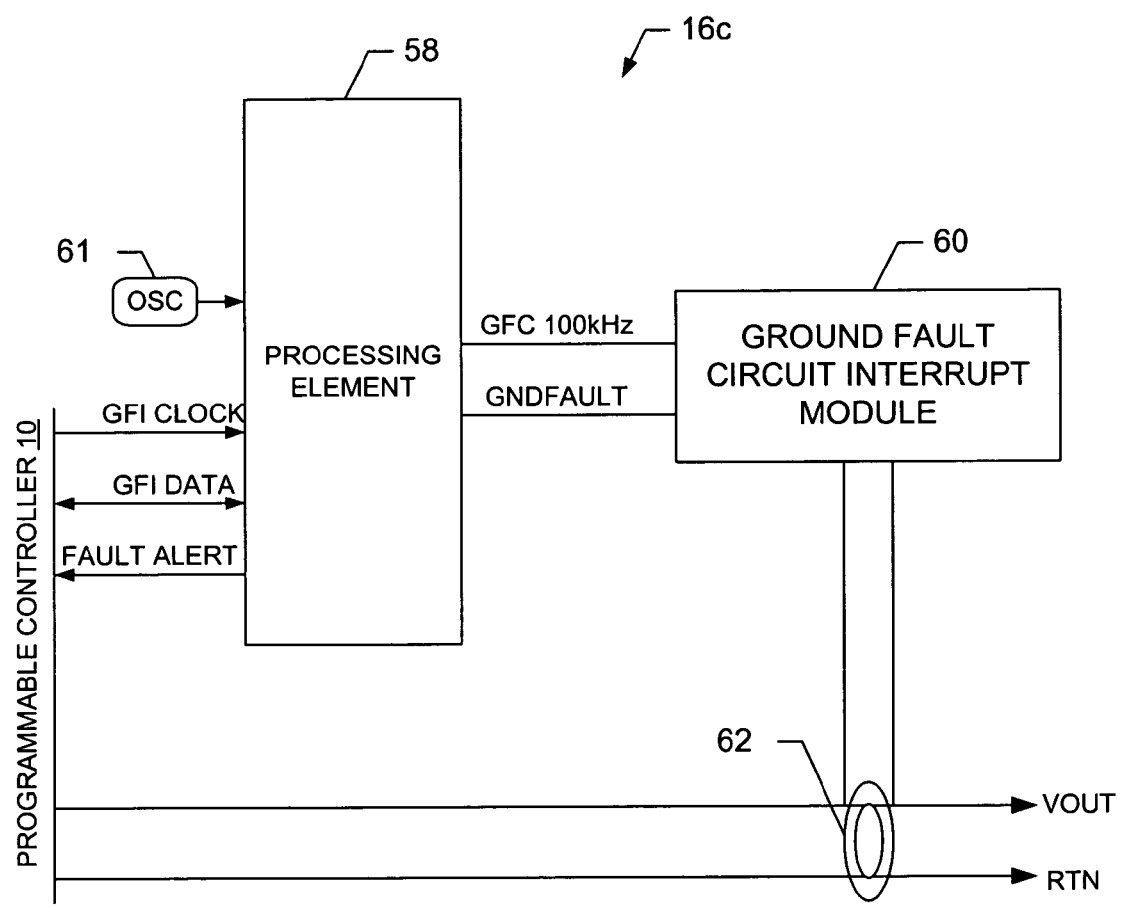
Figure 6:
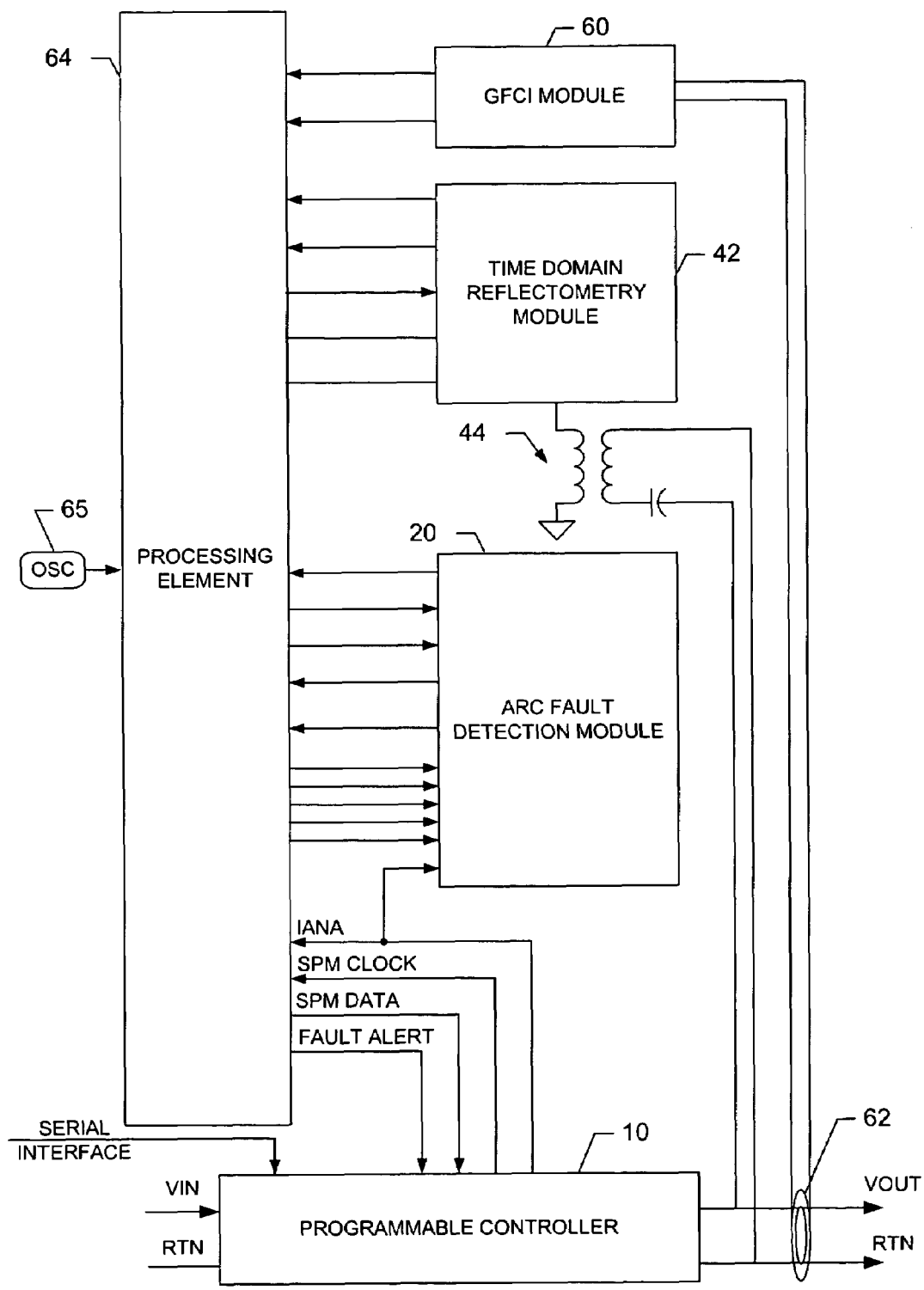
Figure 7:
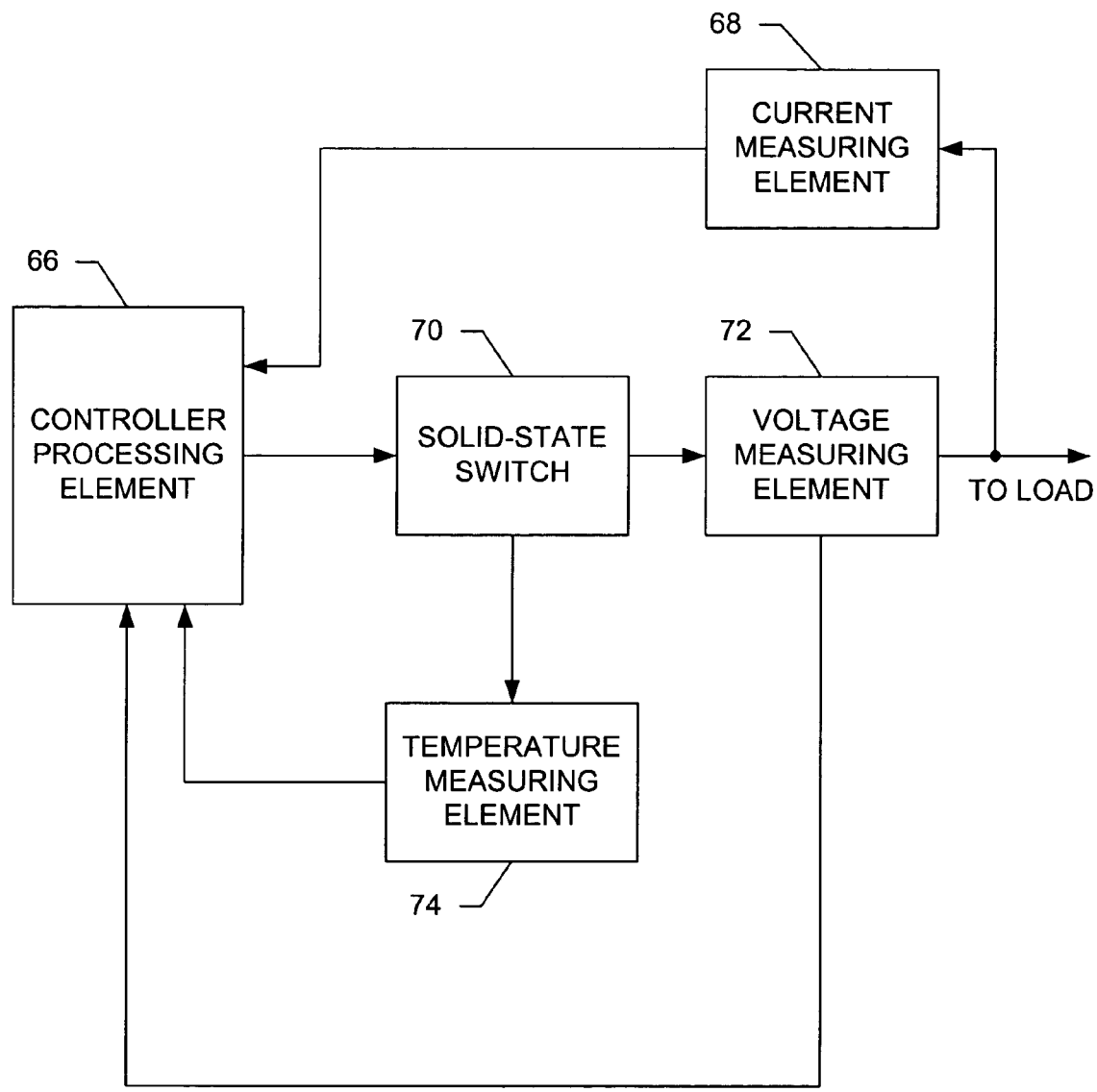
Figure 8:
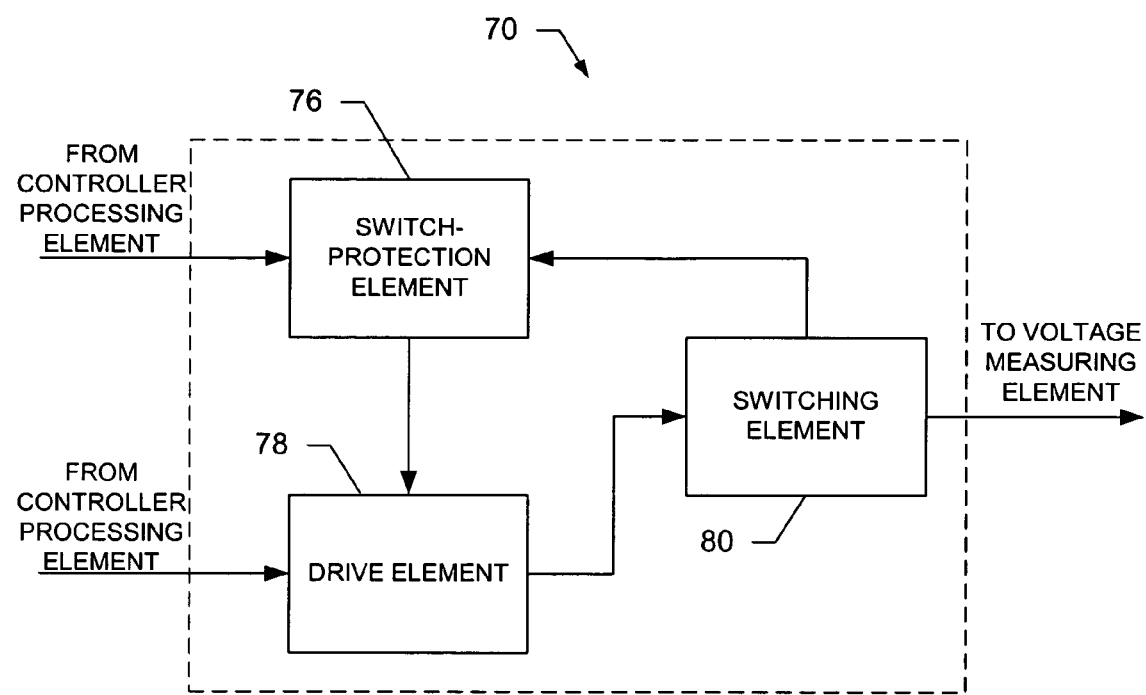
Figure 9:
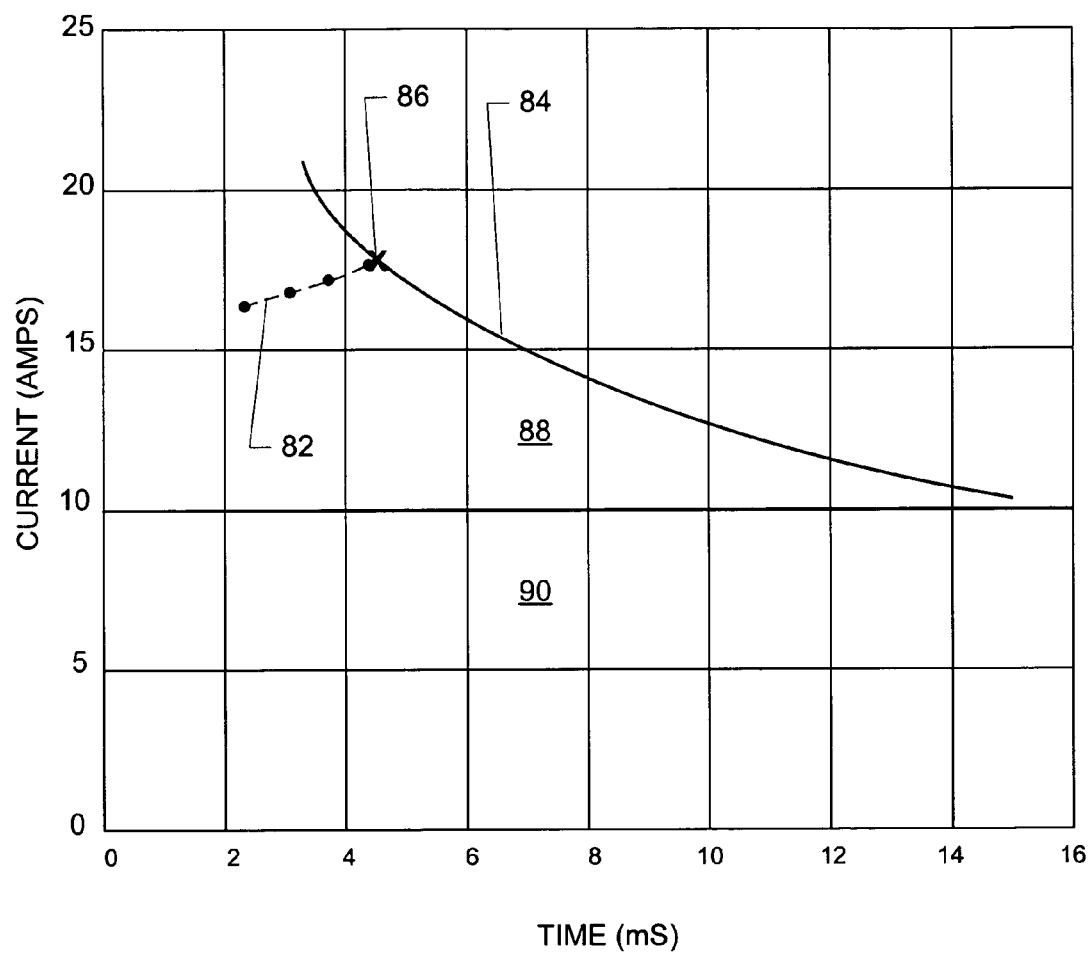
Figure 10A:
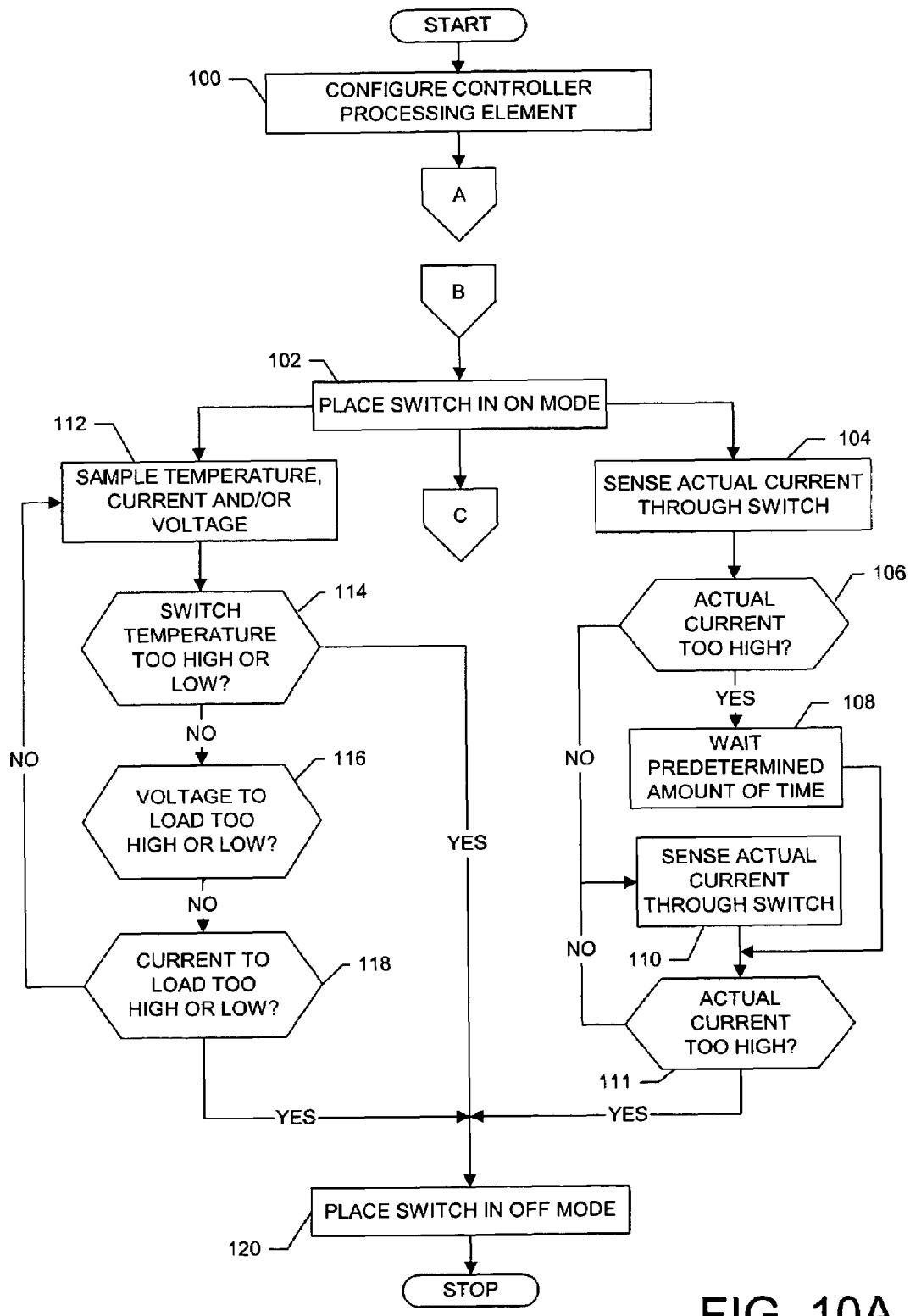
Figure 10B:
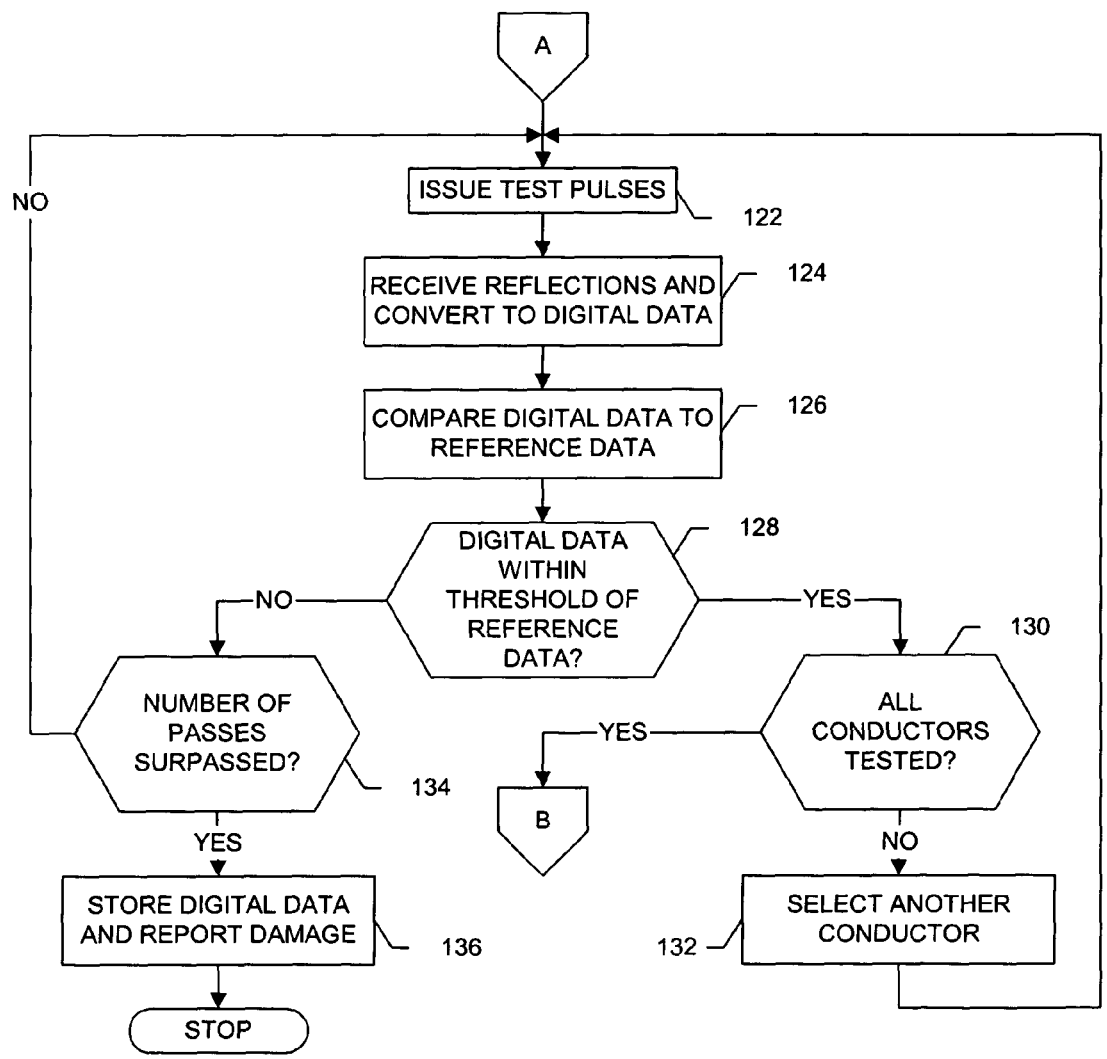
Figure 10C:
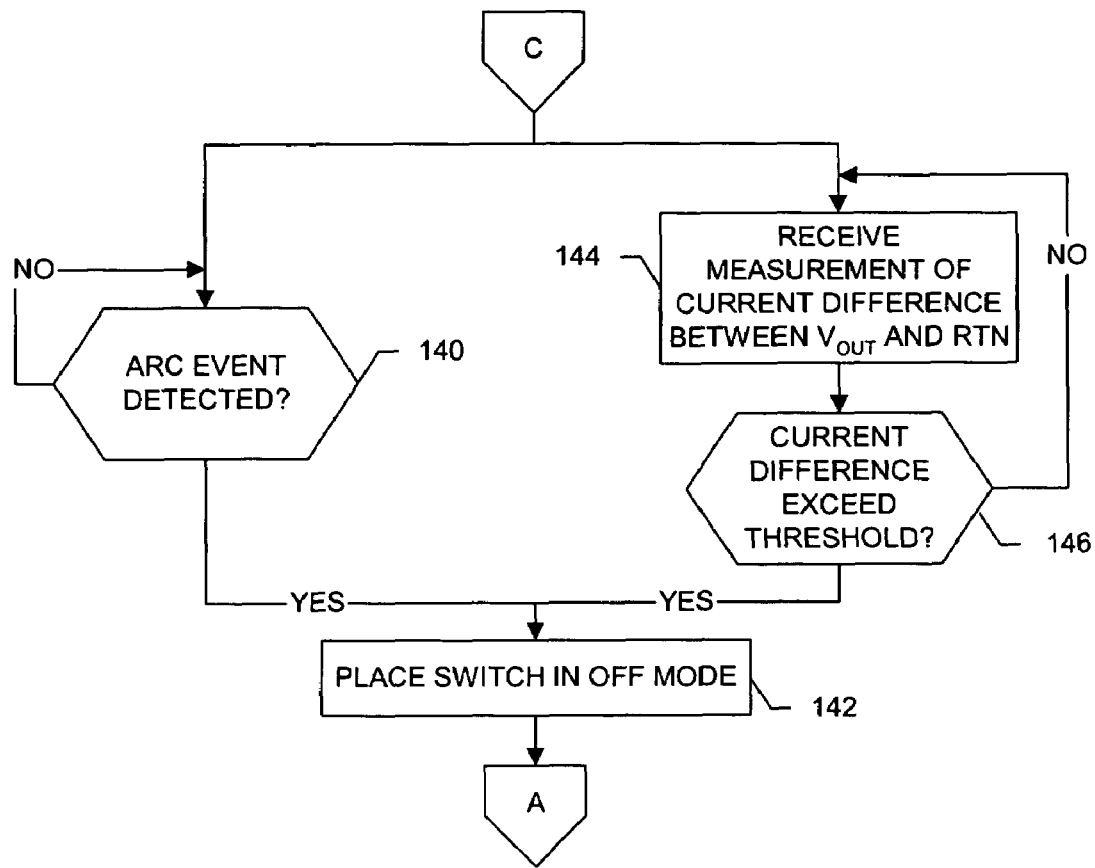

Having thus described the invention in general terms, reference will now be made to the accompanying drawings, which are not necessarily drawn to scale, and wherein:

FIG. 1 is a block diagram of a system of remotely controlling at least one load according to one embodiment of the present invention;

FIG. 2 is a block diagram of a supplemental protection module according to one embodiment of the present invention;

FIG. 3 is a block diagram of an arc fault detector according to one embodiment of the present invention;

FIG. 4 is a block diagram of a damaged wire detector according to one embodiment of the present invention;

FIG. 5 is a block diagram of a ground fault circuit interrupt according to one embodiment of the present invention;

FIG. 6 is a block diagram of a supplemental protection module including an integrated arc fault detector, damaged wire detector and ground fault circuit interrupt according to one embodiment of the present invention;

FIG. 7 is a block diagram of a programmable controller including a single solid-state switch and multiple measuring devices according to one embodiment;

FIG. 8 is a block diagram of a solid-state switch according to one embodiment of the present invention;

FIG. 9 is a graph illustrating a characteristic trip curve for a respective load and several current parameter measurements for the respective load; and FIGS. 10A, 10B and 10C are flow charts of a method of remotely controlling an input current from a master controller through at least one switch to at least one load according to one embodiment.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

FIG. 1 is an illustration of a system that would benefit from the damaged wire detector of one embodiment of the present invention. This illustration is provided so that a more complete understanding of the present invention may be appreciated. It must be understood that the present invention is not limited to this configuration and may be embodied in many different power systems.

With regard to FIG. 1, a general embodiment of a power system in which the present invention is used is shown. The system, typically used to power devices onboard airplanes and automobiles, includes a programmable controller (i.e., slave controller) 10 disposed proximate and electrically connected to at least one load 14, such as one or more electrical components, systems and/or subsystems. For example, the programmable controller can be used to drive electric motors and servos, therefore replacing high maintenance hydraulic devices. The programmable controller can provide either alternating current (AC) current and voltage or direct current (DC) current and voltage to the loads, depending upon operation of the loads. As shown and described herein, however, the programmable controller is particularly adapted to provide DC current and voltage to the loads. But it should be understood that the programmable controller can equally provide AC current and voltage to one or more loads, as desired.

The programmable controller 10 can be electrically connected to the loads 14 via electrical conductors, such as copper wires or the like. By using one programmable controller to control multiple loads, and by disposing the controller proximate the loads as opposed to in one central, humanly accessible location, cabling in the system is reduced which, in turn, reduces wire losses in the system, and reduces the weight of the system. The programmable controller can be electrically connected to a remote master controller 12, such as a high-level processor or computer, which controls the input current to the loads through the programmable controller. Although the programmable controller can be electrically connected to the master controller, the programmable controller can additionally, or alternatively, be configured to operate independent of the master controller or any other type of controller.

Electrically connected between the programmable controller 10 and the loads 14, the system includes a supplemental protection module 16. The supplemental protection module is capable of monitoring the current output of the programmable controller for conditions conducive to an electric arc event. In addition, the supplemental protection module is capable of monitoring the impedance conditions associated with the conductors connecting the programmable controller, as well as with the loads. By monitoring the conductors, as well as the current from the programmable controller, the programmable controller can be operated to prevent power from being applied across a damaged conductor or load, as well as to prevent the creation of an arc event.

The programmable controller 10 and the remote master controller 12 can each draw power from a variety of sources as such are known to those skilled in the art. For example, in devices such as airplanes and automobiles, the programmable controller and remote master controller, in addition to the loads 14, can draw power from the device's existing power bus. Additionally, or alternatively, the programmable controller and/or master controller can be connected to a stand-alone power source that supplies power to the programmable controller and/or master controller. The master controller of the system can additionally be connected to various other electrical systems within various devices. For example, in the automotive industry, the master controller can interface with the vehicle management system and carry out the vehicle management system instructions to the loads in an autonomous fashion. It should be understood that, although the system illustrated depicts one programmable controller electrically connected to one master controller, a single master controller can be, and preferably is, electrically connected to multiple remote programmable controllers without departing from the spirit and scope of the present invention. In turn, a supplemental protection module 16 can be, and preferably is, electrically connected between each programmable controller and the loads connected to the respective programmable controller.

As previously mentioned, the master controller 12 controls the input current to the loads 14 through the programmable controller 10. As such, the programmable controller can be used as a power relay or a circuit breaker, depending upon the desired application and the types of loads connected. As discussed below with reference to the programmable controller controlling the loads, the master controller controls the programmable controller by continuously monitoring the programmable controller, controlling the output current from the programmable controller to the loads such as in on and off modes, selecting the various system parameters such as current, voltage and temperature limits, and programming the various system parameters into the programmable controller. Alternatively, or additionally, the programmable controller can be preprogrammed before integration into a device and run free from control from the master controller. Therefore, throughout the description of the present invention, reference will only be made to the programmable controller. But it should be understood that the control features of the programmable controller can be performed by the master controller and/or the programmable controller. For more information on such a programmable controller, see U.S. patent application Ser. No. 09/842,967, entitled: Programmable Controller For Remotely Controlling Input Power Through a Switch to a Load and an Associated Method of Operation, filed Apr. 26, 2001, the contents of which are hereby incorporated by reference in its entirety.

Referring now to FIG. 2, in one embodiment, the supplemental protection module 16 includes an arc fault detector 16a, a damaged wire detector 16b, and can additionally include a ground fault circuit interrupt 16c. The arc fault detector is capable of monitoring the current flow through the programmable controller for anomalies associated with an arc event. The arc fault detector can monitor the current flow at any time, but in one embodiment, monitors the current flow after or while the programmable controller applies power to the loads. In this regard, the arc fault detector can monitor current flow through the programmable controller after power has been applied, or as power is applied, to the loads to attempt to detect an arc event before widespread damage occurs in the system.

The damaged wire detector 16b is capable of monitoring the impedance conditions associated with the conductors connecting the programmable controller 10 to the loads, as well as the loads 14. Typically, the conductors are tested before applying power to the loads to thereby prevent malfunction in the system upon applying power to the loads. The damaged wire detector can detect a damaged wire and attempt to locate the damage in any of a number of different manners, such as according to a time domain reflectometry technique, as described below. The ground fault circuit interrupt 16c, which may or may not be integrated within the damaged wire detector, is capable of monitoring for stray currents or otherwise abnormal currents on the conductors that may indicate a ground fault in one of the conductors and/or an electric arc event, such as from a conductor to ground.

Reference is now drawn to FIG. 3, which illustrates a schematic block diagram of an arc fault detector 16a according to one embodiment of the present invention. Generally, an arc, as are most natural events, is composed of 1/f (pink) noise at low frequencies and white noise at higher frequencies. The arc fault detector, then, is capable of monitoring the output current from the programmable controller 10 for white noise of sufficient amplitude, which may be indicative of an arc event. For example, the arc fault detector can monitor the output current for amplitudes that exceed background noise by a predefined threshold. White noise may be defined as high spectral density (characterized by a multitude of frequency content), with a signal strength approximately equal in the same bandwidth irrespective of the respective frequency examined. In addition, arc events can be characterized by chaotic behavior in signal strength. Thus, the arc fault detector, is further capable of monitoring the output current from the programmable controller for chaotic behavior which, along with the white noise, may characterize an electric arc event.

The arc fault detector 16a can include a processing element 18 capable of controlling operation of an arc fault detection module 20, which may comprise analog circuit elements such as operational amplifiers, filters and comparators, as described more fully below. In this regard, the arc fault detector can include an oscillator 21 capable of driving the processing element to operate the arc fault detection module. The processing element is capable of signal processing a narrow band of current in the audio region while attempting to locate characteristics of an arc event. For example, the processing element can process the audio region to monitor the spectral density of the current in combination with chaotic amplitude changes. If high spectral density/chaotic amplitude changes are detected, the processing element can inform the programmable controller 10 which, in turn, can prevent current from being passed to the loads, as described more fully below. In this regard, current having a high spectral density can be defined as that current with at least a portion present in all frequencies. Also, current with chaotic amplitude can be defined as that current lacking a pattern repetition.

In the embodiment shown in FIG. 3, the arc fault detection module 20 can include a front-end high pass filter/gain stage 22 that feeds the output current (IANA) from the programmable controller 10 to a switchable band-pass filter 24. The high pass filter/gain stage can comprise any of a number of different high pass filters, such as a 8 kHz, 3 pole high pass filter. The high pass filter/gain stage is capable of attenuating strong load related components, such 60 and 400 Hz fundamentals and their associated harmonics when the programmable controller provides AC current and voltage to the loads, and capable of attenuating DC and low frequency switching currents when the programmable controller provides DC current and voltage to the loads. By attenuating strong load related components, the high pass filter/gain stage can prevent the output current from driving the signals to the voltage rails of the other components in the arc fault detection module, as described below. The high pass filter/gain stage also provides some gain to signals above a predefined frequency (e.g., 8 kHz) to thereby facilitate detecting small arc fault characteristics in the output current.

The band-pass filter 24 can comprise a state-variable analog filter, such as a 4 pole band-pass filter, having any of a number of bandwidths with any of a number of different selectable center frequency ranges. In one embodiment, for example, the band-pass filter has a bandwidth of approximately 500 Hz, and has a center frequency selectable between 8 and 21 kHz. The processing element 18 can select the center frequency of the band-pass filter, such as by passing a digital center frequency selection through a digital-to-analog (D/A) converter 26. The center frequency is advantageously selectable such that the processing element can monitor for characteristics that are indicative of electric arcs in all bandwidths, such as across the entire upper audio region. In this regard, the band-pass filter slices out a spectrum of the output current from the programmable controller 10 within which to monitor for characteristics that lead to an electric arc. And because an electric arc is spectrally dense, its presence will typically be identifiable in the audio range without interference from high frequency noise.

The output from the band-pass filter 24 can be fed into another gain stage 28, which can pass the output to a current-differencing amplifier (CDA) 30, a threshold detector 32 (described below) and a zero-crossing comparator 34 (described below). Advantageously, the CDA of one embodiment includes a diode front-end, which allows the CDA to operate as a very effective non-linear amplifier. In this regard, the CDA can generate sum and difference products. In other terms, the CDA can generate harmonics for sine and other than pure sine waves. However, if a signal is in a bandwidth between a lower frequency and a higher frequency, is complex and has spectral density, the output of the CDA can consist of all frequencies between 0 and the difference between the higher and lower frequencies due to the difference. Similarly, the output of the CDA can also consist of all frequencies between two times the lower frequency and the sum of the higher and lower frequencies due to the sum. For example, for a signal in the bandwidth between 8 and 9 kHz that is complex and has spectral density, the output can consist of all frequencies between 0 and 1 kHz due to the difference, and all frequencies between 16 and 17 kHz due to the sum.

The output of the CDA 30 can be AC coupled to remove any DC bias and then passed through a low pass filter 36, such as an analog 500 Hz low pass filter. The low pass filter can pass only the signal due to the difference, as processing the signal due to the difference is sufficient to monitor for spectral density. It will be appreciated, however, that the amplitude of the signal due to the difference is not a measure of spectral density. To measure spectral density in the arc fault detection module 20 would require a very narrow band filter in place of the low pass filter to monitor for tight difference frequencies. Such a narrow band filter would add complexity to the arc fault detector 16, however, and still not guarantee spectral density as just two slightly separated frequencies could produce the output.

The output from the low pass filter 36 is therefore passed through another zero-crossing comparator 37, which can have some hysteresis and reference offset (Vref). Thereafter, the processing element 18 can take timing measurements of the pulse edge-to-edge "scattering" within a certain time period (e.g., 20 msec) to determine, and be certain of, the presence of frequencies in a specified band (e.g., 0 to 500 Hz). From the timing measurements, then, an arc event can be detected, such as by reviewing the measurements within the time period to determine whether the time between pulse edges and/or the width of the pulses vary in a random pattern. In addition to passing the output of the low pass filter to comparator 37, the output of the low pass filter can also be passed as an analog signal (MIXANA) to the processing element. The processing element, in turn, can monitor the output for chaotic amplitude behavior. In this regard, the low frequency of the output signal facilitates the processing element finding and comparing the local peaks to determine if a chaotic pattern exists between the peaks.

As indicated above, gain stage 28 can pass the output from band-pass filter 24 to threshold detector 32 and comparator 34. The threshold detector, which can comprise a precision rectifier, is capable of measuring the signal strength in the selected frequency band of the band-pass filter. In this regard, if the signal strength exceeds a certain threshold level in each bandwidth, an electric arc may be present in the signal. From the threshold detector, the signal strength can be low pass filtered (not shown), and thereafter input to the processing element 18 as an analog signal (THRESDET).

Comparator 34 also receives the output from the band-pass filter 24, and thereafter passes the output to the processing element 18. Comparator 34, which can have some hysteresis and reference offset (Vref), allows the processing element to make timing measurements between pulse edges within the selected frequency band. In this regard, the processing element can control operation of the comparators 34, 37 via strobe signals (STROBE A and STROBE B) to each comparator. Spectral density will typically be evident in each band during an electric arc event. For example, spectral density can be determined from examining the zero crossings from the output of the gain stage 28. In this regard, if an electric arc having a very wide-band spectrum is band-pass filtered (utilizing band-pass filter 24), such as from 2 to 4 kHz, zero crossings from between 0.25 ms and 0.125 ms would be apparent. The output of the band-pass filter can be amplified (utilizing gain stage 28) to the point of clipping to make a 0 to 5 volt signal swing. The processing element can then count the time between the zero crossings for a period of approximately 50 ms, or about 100 samples. Thereafter, the processing element can make timing measurements to check for a completely random pattern of the zero-crossings at all possible time intervals. As will be appreciated, a non-spectrally dense signal, like a square wave, would not pass such a test, even though the square wave has a lot of frequency content with the square wave's odd harmonics.

The processing element 18 is also capable of communicating with the programmable controller 10. In this regard, the programmable controller can clock data into and out of the processing element, such as the data utilized by the processing element to determine if an electric arc event is occurring, utilizing signal lines AFD CLOCK and AFD DATA as shown in FIG. 3. In addition, the processing element can transmit a notification, alert or the like to the programmable controller, such as when the processing element detects an electric arc event. As shown in FIG. 3, then, such a notification, alert or the like can be transmitted to the programmable controller utilizing the FAULT ALERT signal line. For more information on such an arc fault detector, see U.S. patent application Ser. No. 10/662,565, entitled: System, Arc Fault Detector and Method for Remotely Detecting and Locating Electric Arc Fault Events in A Power System, filed Sep. 15, 2003, the contents of which are hereby incorporated by reference in its entirety.

Reference is now drawn to FIG. 4, which illustrates a schematic block diagram of a damaged wire detector 16b according to one embodiment of the present invention. The damaged wire detector includes a processing element 40 capable of controlling operation of a time domain reflectometry (TDR) module 42. As described more fully below, the processing element can be capable of transmitting signals onto the conductors between the programmable controller 10 and the loads 14, and receiving digital data representative of signals reflected back from the conductors. In this regard, the damaged wire detector can include an oscillator 43 capable of driving the processing element to transmit signals and receive the digital data.

In addition to the processing element and oscillator 43, the damaged wire detector can include an isolation transformer 44 capable of injecting a pulse onto the output. The TDR module is capable of transmitting a series of test pulses down the conductors connecting the programmable controller 10 and the loads 14. Each test pulse can propagate down the conductors and, at a termination point, reflect back to the TDR module, which can receive the reflection and thereafter generate digital data representative of the reflection. Thereafter, the processing element 40 can analyze the digital data to determine if a conductor is damaged and attempt to identify a location of the damage.

More particularly, the TDR module 42 can comprise a driver 46 through which each test pulse is driven onto the conductors via the isolation transformer 44. The test pulse can comprise any of a number of different predetermined pulses, such as a 1 microsecond, 5 volt analog pulse. If desired, the test pulse can be passed through a resistor, such as a 25 Ohm resistor, before passing through the transformer to thereby give the driver an output impedance that forms a divider with the conductor impedance. Upon receiving the reflection back from the conductors via the transformer, the analog reflection can be converted to digital data representative of the reflection by passing through a comparator 68, which compares the analog reflection to an analog pulse width modulated (PWM) controlled DC threshold signal, as such will be appreciated by those skilled in the art.

To allow the TDR module 42 to receive reflections of different magnitudes to thereby detect termination points of different magnitudes and at different lengths along the conductors, the reflection from each test pulse can be converted to digital data with different thresholds. For example, the reflections can be converted to digital data with different thresholds by comparing the reflections to a DC threshold level reference generated from an adjustable PWM signal. In this regard, the magnitude of the threshold signal, and thus the threshold of the resulting digital data, can be set by a level adjust element 50. Also, before passing through the level adjust element, the threshold signal can be filtered, such as by filter 52, which can comprise any of a number of different conventional electrical elements, such as resistors 52a, capacitors 52b or the like. In this regard, the threshold signal can be filtered to generate the DC threshold level reference. The DC threshold level reference can then be scaled and offset to produce threshold level settings for the comparator 68. The threshold level settings can comprise any of a number of different levels, but in one embodiment, the threshold signals range from +7 volts to −7 volts in approximately 0.78 volt increments.

After converting the analog reflections to digital data representative of the reflections, the digital data can be passed to the processing element 40 for analysis to determine if a conductor is damaged and attempt to identify a location of the damage. The digital data can be passed to the processing element in any of a number of different manners, such as by being passed directly to the processing element. In a more typical embodiment, however, the digital data is passed to a buffer, such as a first-in-first-out (FIFO) buffer 54, which thereafter passes the digital data to the processing element. The FIFO buffer can comprise any of a number of known FIFO buffers, such as a 512×1 FIFO buffer. The FIFO buffer permits the processing element 18 to receive the digital data at a lower rate than which it was generated. Operation of the FIFO can be controlled by an oscillator 56 that, in turn, is controlled by the processing element. In this regard, receipt of the processing element of the digital data can be controlled by controlling the oscillator. As such, the processing element can enable operation of the TDR module 42 via control of the oscillator.

The oscillator 56 can clock the digital data into the FIFO buffer 54 from the comparator 48 at any of a number of different rates such as, for example, at 100 MHz. In this regard, a rate of 100 MHz provides 10 nano-second timing resolution, or on the order of one or two meter distance resolution for typical conductors. Similarly, the oscillator can clock the digital data from the FIFO buffer to the processing element 40 at any of a number of different rates. In addition to passing the digital data to the processing element, the FIFO buffer can also output the clock signal from the oscillator 56 to the processing element. In this regard, the processing element can receive the digital data and associated clock signals such that the processing element can synchronize the digital data with reference data for comparison to determine if the conductors are damaged.

More particularly, the processing element 40 can compare the digital data with reference data in memory to determine if the conductors are damaged. As will be appreciated by those skilled in the art, according to the time domain reflectometry technique, as the test pulses are transmitted down the conductors, all or part of the pulse energy is reflected back along the conductors when the pulses reach the end of the conductor or reach damage along the length of the conductor. The processing element can then measure the time required for each test pulse to travel down the conductors and reflect back, and convert the time to distance, which is thereafter compared to a reference length. The reference length can be determined in any number of different manners, such as from the reference data. The reference data, in turn, can comprise data stored in memory, such as during "calibration" of the TDR module 42. In this regard, the TDR module can be calibrated by, for example, collecting the reference data as the results of the testing a known good conductor/load. As will be appreciated, distances determined from the digital data that are significantly shorter than corresponding distances determined from the reference data can be regarded as locations of damage along the length of the conductors. The differences between the distances determined from the digital data and the corresponding distances determined from the reference data required to indicate a location of damage can be selected in any of a number of different manners to provide any of a number of different levels of tolerance of the system. For example, the difference required to indicate the location of damage can be selected to be greater than five percent of the distance determined from the reference data.

The processing element 40 is capable of communicating with the programmable controller 10. In this regard, the programmable controller can clock data into and out of the processing element, such as distances determined from the digital data and/or the reference data, utilizing signal lines TDR CLOCK and TDR DATA as shown in FIG. 4. In addition, the processing element can transmit a notification, alert or the like to the programmable controller, such as when the differences between the distances determined from the digital data and the corresponding distances determined from the reference data required to indicate a location of damage exceed a threshold, as described more fully below. As shown in FIG. 2, then, such a notification, alert or the like can be transmitted to the programmable controller utilizing the FAULT ALERT signal line. For more information on such a damaged wire detector, see U.S. patent application Ser. No. 10/663,600, entitled: System, Damaged Wire Detector and Method for Remotely Detecting and Locating Damaged Conductors in A Power System, filed concurrently herewith, the contents of which are hereby incorporated by reference in their entirety.

Referring to FIG. 5, a ground fault circuit interrupt 16*c* is shown according to one embodiment of the present invention. As shown, the ground fault circuit interrupt includes a processing element 58 capable of driving a ground fault circuit interrupt module 60 to monitor the conductors for stray currents that may indicate a short circuit to ground in one of the conductors and/or an electric arc event to ground. Like in the arc fault detector 16*a* and the damaged wire detector 16*b*, the ground fault circuit interrupt can include an oscillator 61 capable of driving the processing element to monitor the conductors. The ground fault circuit interrupt module can comprise any of a number of known analog elements, such as operational amplifiers, comparators and the like, capable of detecting a difference in the currents in the pair of conductors (Vout and RTN), which may indicate a short circuit and/or an electric arc event.

The ground fault circuit interrupt module 60 is capable of receiving a pulse signal, such as a 100 kHz pulse (i.e., GFC 100 kHz), from the processing element 58. With each pulse, then, the ground fault circuit interrupt module can receive a measurement representative of the current difference between the pair of conductors to the loads, as such may be determined by passing the currents through the core of a sensing transformer 62. As will be appreciated by those skilled in the art, the conductors can pass through the core of the sensing transformer so that the currents in the conductors at any instant are flowing in opposing directions. If the currents in the conductors are exactly equal, then, a net magnetic flux of zero will be affected in the core. A non-zero net current in the conductors, however, can bias the transformer toward saturation. At any current difference, then, the secondary output voltage of the transformer can be representative of the current difference in the conductors, as opposed to the pulse level driven onto the primary of the transformer.

Like with the arc fault detector 16*a* and the damaged wire detector 16*b*, the processing element 58 of the ground fault circuit interrupt module 60 is capable of communicating with the programmable controller 10. In this regard, the programmable controller can clock data into and out of the processing element, utilizing signal lines GFI CLOCK and GFI DATA as shown in FIG. 5. In addition, when the current difference in the conductors exceeds a predefined threshold, the ground fault circuit interrupt module 60 can transmit a notification to the processing element (GNDFAULT), which can thereafter notify the programmable controller 10. In turn, the programmable controller can operate to prevent current from reaching the loads 14, as described more fully below. The predefined threshold can be set in any of a number of manners but, in one embodiment, the threshold is set at approximately 4-6 mA. To verify a short circuit and/or arc event after operating the programmable controller to prevent current from reaching the loads, the damaged wire detector can test the conductors, such as by transmitting test pulses down the conductors and receiving, and thereafter analyzing, reflections received from the conductors, as indicated above and described more fully below.

As shown in FIGS. 3, 4 and 5, each of the arc fault detector 16*a*, damaged wire detector 16*b* and ground fault circuit interrupt 16*c* of the supplemental protection module 16 can each include a processing element 18, 40 and 58, respectively. As will be appreciated by those skilled in the art, one or more of the elements of the supplemental protection module can include the same processing element without departing from the spirit and scope of the present invention. For example, as shown in FIG. 6, the processing elements of the arc fault detector, the damaged wire detector and the ground fault circuit interrupt can be embodied in a single supplemental protection processing element 64, with oscillators 21, 43 and 61 embodied in a single oscillator 65. In such an embodiment, the supplemental protection module comprises the supplemental protection processing element, the oscillator, and additionally includes the remaining elements of the arc fault detector, the damaged wire detector and the ground fault circuit interrupt. More particularly, the supplemental protection module further includes the ground fault circuit interrupt (GFCI) module 60, the sensing transformer 62, the TDR module 42, the isolation transformer 44 and the arc fault detection module 20. As will be appreciated, in such an embodiment, the single supplemental protection element processing element can communicate with the programmable controller 10 such as to clock data into and out of the supplemental protection element processing element utilizing signal lines SPI CLOCK and SPI DATA.

Referring now to FIG. 7, the programmable controller 10 of one embodiment of the present invention includes a controller processing element 66. The controller processing element can be any of a variety of processors, such as, for example, the PIC17C752 microcontroller manufactured by Microchip Technology Inc. The controller processing element monitors and controls the functions of at least one, and preferably multiple, solid-state switches 70, discussed below. Not only does the controller processing element monitor and control the functions of the switches, the controller processing element also determines a condition of the switches and/or loads by performing calculations in the firmware using preconfigured characteristics and measured parameters of the switches and/or loads. The controller processing element allows the programmable controller to provide flexibility to the power system of the present invention not available with conventional circuit breakers or relays. By emulating the material limitations of conventional circuit breakers and relays with firmware, the controller processing element of the programmable controller overcomes the material limitations of conventional circuit breakers and relays, by having the capability to reprogram the controller processing element for different loads, as opposed to changing discrete components (i.e., conventional circuit breakers and relays). Also, the programmable controller allows for a wide variety of power control implementations to be programmed and made selectable by the system, such as various trip-curve implementations. In addition, the controller processing element can caution an operator if a dangerous condition is encountered, or the controller processing element can automatically control the respective switch accordingly.

The programmable controller 10 also includes at least one, and preferably more than one, solid-state switch 70, each connected to a respective load 14. While the illustration of FIG. 7 depicts only a single solid-state switch, it should be understood that the figure is for illustrative purposes only, and should not be taken to limit the scope of the present invention. In one embodiment, illustrated in FIG. 8, each solid-state switch includes a switching element 80, a drive element 78 and a switch-protection element 76. While the switching element can comprise any number of different solid-state switches, such as a MOSFET or an IGBT, the switching element acts to alter the input current to the respective load, typically operating in either an on mode wherein the switching element permits the respective load to receive the input current, or an off mode wherein the switching element prevents the respective load from receiving the input current. As previously stated, a solid-state switch eliminates the mechanical contacts of conventional circuit breakers and relays which, in turn, eliminates the erosion and other problems associated with mechanical contacts.

The solid-state switch 70 also includes a drive element 78 that provides the input current to the switching element 80, and typically comprises circuitry consisting of conventional electrical components such as resistors, diodes and transistors. Additionally, the solid-state switch may include a switch-protection element 76 that protects the switching element against instantaneous over-current conditions that could damage the switching element. The switch-protection element can comprise any of a number of different configurations, but, like the drive element, typically comprises conventional electrical components such as diodes, transistors, resistors and capacitors.

In operation, the switch-protection element 76 senses an actual current through the switching element 80. If the actual current is above a predetermined value, such as a maximum current rating of the switching element, the switch-protection element alters the actual current through the switching element so that the actual current is no more than the predetermined value, typically placing the switching element in the off mode. In some instances when the solid-state switch 70 is initialized at start-up, an inrush of actual current flows through the switching element. But while this current may be above the predetermined value, it typically settles down to a level at or below the predetermined value within a fairly short time. To account for this inrush of current and prevent the switch-protection element from prematurely altering the input current, the switch-protection element of one embodiment is capable of waiting a predetermined amount of time before monitoring the level of current through the switching element. This predetermined amount of time allows the level of current to settle to a more constant, operation level before the switch-protection element monitors the switching element for instantaneous over-current situations. Additionally, or alternatively, the switch-protection element can be configured to control the actual current in different manners at different times or in different modes of operation. For example, the switch-protection element can be configured to step down the predetermined value at which current is interrupted from an initial, elevated value to a stable, constant value at the conclusion of the predetermined amount of time.

Referring again to FIG. 7, the programmable controller 10 of the present invention includes at least one, and preferably more than one, measuring element that measures various conditions of the loads 14 and solid-state switches 70. For example, the programmable controller may include a current measuring element 68 and/or a voltage measuring element 72 that measure the input current through and voltage drop across a respective load. Additionally, the programmable controller may include a temperature measuring element 74 that measures the temperature at or around the solid-state switch. The current and voltage measuring elements are typically made from conventional electrical components such as resistors, capacitors and operational amplifiers. Also, the temperature measuring device can be made from any number of devices, such as the LM75 digital temperature sensor, manufactured by National Semiconductor. In operation, the measuring elements protect the loads 14 and/or solid-state switches 70 from undesirable conditions such as over-current, over and under voltage, and over and under temperature conditions by comparing such measured parameters against predetermined values for the respective load and/or switch. For example, the predetermined value for each load may be based upon material characteristics of the load, such as a maximum current or voltage rating, or a minimum operational voltage. Also, for example, the predetermined temperature value for each solid-state switch may comprise a maximum temperature rating for the respective solid-state switch, over which damage is caused to the solid-state switch. Additionally, the predetermined value based upon current or voltage rating characteristics can additionally take into account the predetermined temperature value because the current and voltage characteristics of various loads typically change over a range of temperatures.

Referring to FIG. 9, typically, the controller processing element 66 compares the measured parameters against the predetermined values by first constructing a model trip curve 82 comprising a plurality of measured parameter values at different points in time. The controller processing element compares the model trip curve against a characteristic trip curve 84 for the respective load and/or switch. The characteristic trip curve is typically predefined based upon a characteristic of the switch and/or load associated with the particular parameter, such as a current rating characteristic trip curve associated with the measured input current through the switch and/or to the load. FIG. 9 illustrates a characteristic trip curve along with a constructed model trip curve for a switch and/or a load with a ten amp current rating. Although not illustrated, the characteristic trip curve can additionally be predefined based upon a combination of the various parameters associated with the switch and/or load, such as the temperature of the switch and/or load along with another parameter of the switch and/or load since many parameters of the switch and/or load may vary depending on the temperature of the switch and/or load. The characteristic trip curve is stored by the controller processing element or an associated memory device, thus making any trip curve implementation possible, such as $I^2T$ and tiered. The predetermined values of the characteristic trip curve are defined to prevent the solid-state switch and/or load from operating too long in a dangerous area 88. By referencing the characteristic trip curve, the controller processing element can keep the measured parameter in a safe area 90, such as below the current rating of the switch and/or the load, and turn off the switch before the switch and/or load can be damaged by crossing a critical point 86 on the characteristic trip curve. If the condition measured by the respective measuring element falls outside the range of predetermined values or above the predetermined value or, more typically, if the model trip curve constructed by the controller processing element based upon the measured parameter or parameters is predicted to reach the critical point on the characteristic trip curve, the controller processing element alters the input current through the solid-state switch accordingly. For example, if the controller processing element in conjunction with the measuring element determine that the input current to the load will remain at or above a certain level for more than the maximum time permitted by the characteristic trip curve within a predefined period of time, the controller processing element can alter the input current to bring the measured value within the predetermined value range or below the predetermined value or, preferably, the controller processing element can place the solid-state switch in the on or off mode.

In another advantageous embodiment, when the input current to the switch and/or the load reaches or exceeds a certain level, such as a maximum current rating or an input current rating, respectively, the controller processing element repeatedly increases a count. If the count exceeds a predetermined threshold representative of the predefined period of time, the controller processing element can alter the input current to reduce the input current to below the certain level, such as by placing the switch in the off mode. But if the input current to the load decreases to below the certain level before the count exceeds the threshold, the controller processing element will repeatedly decrease the count. In this regard, the controller processing element can account for previous current stress (e.g., excess current) to the switch and/or the load should the switch and/or the load experience a subsequent current stress before the count reaches zero since the count would begin upward again, although not from zero but from a value representative of the residual stress on the switch and/or the load.

Referring now to FIGS. 10A, 10B and 10C, a method of remotely controlling the input current from the controller processing element 66 through each switch 70 to each load 14, according to one embodiment of the present invention, begins by configuring the firmware of the controller processing element based upon the desired characteristics of the switches and loads, such as current and voltage ratings of each load, a maximum current rating of each switch and/or a temperature rating of each switch, as shown in block 100. For example, the firmware can be configured with the characteristic trip curves typically predefined based upon the characteristics of the switch and/or load. Additionally, the characteristic trip curves can be predefined based upon a combination of the various characteristics of the switch and/or load, such as the temperature of the switch and/or load along with another parameter of the switch and/or load since many parameters of the switch and/or load may vary depending on the temperature of the switch and/or load. Thus, different characteristic trip curves can be utilized depending upon the temperature of the switch. Additionally, or alternatively, the characteristics of each switch related to current through the switch, such as the maximum current rating, can be configured into the respective switch-protection element 76 to monitor the actual current through the respective switch. Advantageously, by configuring the controller processing element with the characteristics of the switches and loads, if a switch or load with different characteristics is connected to the power system, the controller processing element can be reconfigured such as by constructing and storing the characteristic trip curves associated with the different switch or load, as opposed to replacing the discrete components of conventional circuit breakers and relays.

After the controller processing element 66 has been configured, the damaged wire detector 16b can operate to determine whether any of the conductors are damaged and, if so, determine the location of the damage. Referring now to FIG. 10B, a method of detecting and locating each damage in each conductor begins by transmitting a set of test pulses, such as a set of 1 microsecond, 5 volt analog pulses, down the conductors, as shown in block 122. The comparator 68 can then receive reflections of the test pulses, and thereafter compare the analog reflections to an analog threshold voltage, as shown in block 124. In this regard, the comparator preferably compares the reflection of each test pulse to a threshold signal of a different magnitude, such as by comparing the test pulses to threshold signals ranging from +7 volts to −7 volts in approximately 0.78 volt increments.

The digital data output of the comparator 68, which is representative of the reflections, can then be compared to reference digital data to determine whether the digital data is within a threshold of the reference digital data. More particularly, the time required for each test pulse to travel down the conductors and reflect back can be determined from the digital data, which can thereafter be converted to a distance. The distance can then be compared against a reference distance determined from the reference digital data to thereby determine if the distance determined from the digital data is lengthwise within a threshold of the reference distance. In this regard, the reference digital data can be representative of reflections from known properly operating conductors of the same length and makeup as the conductors tested, as shown in block 126. The reference digital data can be generated in any of a number of different manners but, in one embodiment, the reference digital data is generated by training the damaged wire detector 16b using the conductors at an instance in which it is known that the conductors are functioning properly, such as just after configuring the programmable controller 10 with the damaged wire detector and the loads 14. The threshold can equally be set in any of a number of different manners. In one embodiment, for example, the threshold is set at five percent of the reference digital data (i.e., the distance determined from the digital data is within five percent of the distance determined from the reference digital data).

During the comparison, if the digital data is within a threshold of the reference digital data, the conductor is considered to be functioning properly without any damage. Thereafter, a determination is made as to whether all of the conductors have been tested for damage, as shown in block 130. If all of the conductors have not been tested, another conductor is selected, as shown in block 132. The process can then repeat for the next conductor, beginning with issuing the test pulses down the next conductor, as shown in block 122.

If the digital data is not within the threshold of the reference digital data, the processing element 40 can store the digital data and report the damaged conductor, such as to the programmable controller 10. In a more typical embodiment, however, if the digital data is not within the threshold of the reference digital data, the one or more subsequent tests are performed on the same conductor to verify the damage to the conductor. In this regard, if the digital data is not within the threshold of the reference digital data, the processing element determines whether a predetermined number of passes (e.g., two) have been taken at the respective conductor, as shown in block 134. In other terms, the processing element determines if the respective conductor has failed the test a predetermined number of times by failing to be within the threshold of the reference digital data during any such test. If the predetermined number of passes have not been taken, the process can repeat for the respective conductor, such as beginning with issuing the test pulses, as shown in block 122.

If the predetermined number of passes have been taken and damage has been detected with each pass, however, the processing element 40 can store the digital data and report the damaged conductor (FAULT ALERT), as shown in block 136. As will be appreciated, if the programmable controller 10 receives notification that a conductor is damaged, such as by the digital data for the respective conductor not being within the reference digital data after a predetermined number of passes, the programmable controller will typically prevent current from being applied to the respective conductor, as such is described above.

After testing the conductors with the damaged wire detector 16b, if the damaged wire detectors do not detect a damaged conductor, each switch 70 is operated in the on mode, as desired, to provide the input current to the respective load 14, as shown in block 102 of FIG. 10A. As the switch is operating in the on mode, the switch-protection element senses the actual current through the switch, as illustrated in block 104. If the actual current is above a predetermined value, such as the maximum current rating of the switch, the switch-protection element can wait a predetermined amount of time to allow any inrush of current to settle to a stable level, as shown in blocks 106 and 108. Additionally, or alternatively, the switch-protection element can be configured to control the actual current at different times or in different modes of operation. For example, the switch-protection element and/or controller processing element can be configured to step down the predetermined value from an initial, elevated value to a stable value at the conclusion of the predetermined amount of time. If, after the predetermined amount of time the actual current is still above the predetermined value, the switch-protection element reduces the actual current, such as by placing the switch in the off mode, as shown in blocks 111 and 120). In the event the actual current is below the predetermined value, either initially or after the predetermined period of time, the switch-protection element continuously monitors the actual current to ensure the actual current remains below the predetermined value, as shown in blocks 110 and 111.

As the switch-protection element 76 monitors the switch 70 for an over-current situation, the controller processing element 66 periodically samples the current and/or voltage through and/or across the load 14, and/or samples the temperature of or around the switch to use to obtain a condition of the load and/or switch, as illustrated in block 112. The condition is then determined by comparing the current, voltage and/or temperature against the characteristics predefined by the controller processing element.

The controller processing element 66 can determine if an over temperature or under temperature condition exists in the switch, as shown in block 114. And if so, the controller processing element can alter the input current accordingly. For example, the temperature measuring element can measure the air temperature at or around the switch and compare the measured temperature against the predetermined values for the desired temperature range, such as critical temperature limits. If the measured temperature is below or above the desired temperature range, the controller processing element can place the respective switch in the off mode to prevent the switch from being damaged or from damaging the respective load, as shown in block 120. Alternatively, the controller processing element can construct different characteristic trip curves based upon other parameters to emulate the temperature at or around the switch based upon characteristics of the switch that vary in proportion to the temperature of the switch.

The controller processing element 66 can also determine if an over voltage or under voltage condition exists in the load 14 and alter the input current accordingly, as shown in block 116. For example, if the measured voltage drop across a respective load falls outside the preconfigured voltage range for the respective load, the controller processing element can alter the input current to place the voltage drop within the desired levels or place the respective switch 70 in the off mode.

The controller processing element 66 can also determine if an over current condition exists in the load 14 and, if so, alter the input current to below the predetermined level, as shown in block 124. For example, the controller processing element can determine a model trip curve 82 using a plurality of measured parameter values at different points in time. The controller processing element compares the model trip curve against the characteristic trip curve 84 for the respective load and/or switch 70. The predetermined values in the characteristic trip curve are defined to prevent the switch from operating too long in the dangerous area 88. Additionally, the controller processing element can account for previous current stresses (e.g., previous switch operations in the dangerous area) by maintaining a count. As the switch operates in the dangerous area, the controller processing element repeatedly increases the count. And if the switch returns to operating outside of the dangerous area before the count reaches a predetermined threshold (representative of the maximum amount of time the switch is allowed to operate in the dangerous area), the controller processing element can repeatedly decrease the count as long as the switch remains outside the dangerous area, as previously described. By referencing the characteristic trip curve, the controller processing element can turn off the switch before the switch and/or load can be damaged, such as by placing the switch in the off mode, as shown in block 120.

In addition to monitoring for over or under temperature, voltage or current conditions, the arc fault detector 16a and the ground fault circuit interrupt 16c, can operate to further insure proper operation of the conductors. Although shown and described herein as operating while input current is provided to the loads, the arc fault detector and ground fault circuit interrupt can equally operate at any other time signals are transmitted through the conductors, including during operation of the damaged wire detector 16b, without departing from the spirit and scope of the present invention.

More particularly, as the switch 70 is operating in the on mode, the arc fault detector 16a continuously monitors the output current of the programmable controller 10 for characteristics identifying an arc event, such as in a manner described above and as shown in block 140. If the arc fault detector detects an arc event, then, the arc fault detector can notify the programmable controller, which can respond by placing the switch in the off mode, as shown in block 142. However, the damaged wire detector 16b can also, but need not, be operated to verify the electric arc event during its presence and, if verified, locate the electric arc event, such as in a manner shown in FIG. 10B. If the arc fault detector does not detect an arc event, however, the arc fault detector can continue to monitor the output current of the programmable controller for characteristics identifying a potential arc event.

The ground fault circuit interrupt 16c can detect stray currents on the conductors that may indicate a short circuit in one of the conductors and/or an electric arc event. In this regard, the ground fault circuit interrupt can operate by initially receiving a measurement representative of the current difference between the pair of conductors to the loads, as such may be determined by passing the currents through the sensing coil 62, as shown in block 144. After receiving the measurement, the measurement can be compared to a predefined threshold, as shown in block 146. As indicated above, if the currents in the conductors are exactly equal, then, a net current of zero will be effected in the sensing coil. However, as the sensing coil produces an AC magnetic field external to the conductors, a non-zero net current in the conductors would induce a voltage in the sensing coil.

Therefore, if the current difference in the conductors does not exceed the predefined threshold, the ground fault circuit interrupt 16c typically takes no action with respect to the programmable controller 10. Instead, the ground fault circuit interrupt repeats the technique by again receiving a measurement representative of the current difference in the conductors. The ground fault circuit interrupt can therefore repeatedly receive measurements and compare the measurements to the predefined threshold to attempt to detect a short circuit and/or electric arc event, as evidenced by a difference in the current in the conductors exceeding the predefined threshold.

If the current difference in the conductors exceeds a predefined threshold, the ground fault circuit interrupt 16c can notify the programmable controller 10. In turn, the programmable controller can operate to prevent current from reaching the loads 14, such as by operating the switch 70 in the off mode, as shown in block 142. Then, the damaged wire detector 16c can, but need not, test the conductors, such as according to the technique described above in conjunction with FIG. 10B.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system of remotely detecting and locating faults in a power system, said system comprising:
at least one slave controller disposed proximate at least one load and electrically connected to the at least one load via at least one conductor, wherein the at least one slave controller comprises:
at least one solid-state switch capable of controllably altering the input current to the at least one load; and
at least one measuring element for measuring at least one parameter associated with the at least one load and the at least one solid-state switch, wherein said solid-state switch controllably alters the input current to the at least one load according to the at least one parameter; and
at least one supplemental protection module electrically connected to the at least one conductor between the at least one slave controller and the at least one load, wherein the at least one supplemental protection module is capable of detecting at least one fault in at least one conductor.

2. A system according to claim 1, wherein each supplemental protection module is capable of notifying a respective slave controller when the supplemental protection module detects a fault such that the at least one solid-state switch of the respective slave controller can alter the input current to the at least one load.

3. A system according to claim 1, wherein the at least one solid-state switch operates in at least one mode selected from a group consisting of an on mode wherein the at least one solid-state switch permits a respective load to receive the input current, and an off mode wherein the at least one solid-state switch prevents the respective load from receiving the input current, and wherein when the at least one solid-state switch operates in the off mode the at least one supplemental protection module is capable of testing the at least one conductor before the at least one solid-state switch is placed in the on mode to thereby detect at least one fault.

4. A system according to claim 1, wherein each supplemental protection module is capable of detecting at least one fault comprising at least one damaged conductor by:

transmitting at least one test pulse along at least one respective conductor and receiving at least one reflection from the at least one respective conductor; and comparing the at least one reflection to reference data to thereby at least one of detect and locate at least one damaged conductor.

5. A system according to claim 4, wherein each supplemental protection module is further capable of detecting at least one damaged conductor by converting the at least one reflection to digital data representative of the at least one reflection, and wherein each supplemental protection module is capable of comparing the at least one reflection to reference data by comparing the digital data to the reference data.

6. A system according to claim 5, wherein each supplemental protection module is capable of converting the at least one reflection to digital data with at least one resolution.

7. A system according to claim 4, wherein each supplemental protection module is further capable of determining at least one length of the at least one conductor based upon at least one transit time between transmission of the at least one test pulse and reception of the respective at least one reflection, and wherein each supplemental protection module is capable of comparing the at least one reflection to reference data by comparing the at least one determined length to at least one reference length.

8. A system according to claim 7, wherein each supplemental protection module is capable of comparing the at least one determined length to the at least one reference length and detecting at least one damaged conductor when the at least one determined length is shorter than the respective at least one reference length by more than a threshold length, and wherein each supplemental protection module is capable of locating the damage as a point on the respective at least one conductor at the at least one determined length.

9. A system according to claim 1, wherein each supplemental protection module is capable of detecting at least one fault comprising an electric arc event by detecting at least one of white noise and chaotic behavior in current through the at least one conductor to the at least one load.

10. A system according to claim 9, wherein each supplemental protection module is capable of detecting white noise by detecting a spectrally dense current through the at least one conductor to the at least one load.

11. A system according to claim 9, wherein each supplemental protection module is capable of notifying a respective slave controller when the supplemental protection module detects an electric arc event such that the at least one solid-state switch of the respective slave controller can alter the input current to the at least one load to prevent the respective load from receiving the input current, and wherein when the respective slave controller alters the input current to prevent the respective load from receiving the input current the respective supplemental protection module can at least one of verify the electric arc event and locate the electric arc event on the respective conductor.

12. A system according to claim 1, wherein each supplemental protection module is capable of detecting at least one fault comprising at least one abnormal current representative of at least one of a short circuit and an electric arc event.

13. A system according to claim 12, wherein each conductor comprises a pair of conductors, and wherein each supplemental protection element is capable of detecting at least one fault by:

receiving a measurement representative of a current difference in the pair of conductors; and comparing the measurement to a predefined threshold such that the supplemental protection element is capable of detecting an abnormal current representative of a short circuit when the measurement is greater than the predefined threshold.

14. A system according to claim 12, wherein each supplemental protection module is capable of notifying a respective slave controller when the supplemental protection module detects at least one abnormal current representative of at least one of a short circuit and an electric arc event such that the at least one solid-state switch of the respective slave controller can alter the input current to the at least one load to prevent the respective load from receiving the input current, and wherein when the respective slave controller alters the input current to prevent the respective load from receiving the input current the respective supplemental protection module can at least one of verify the at least one abnormal current representative of at least one of a short circuit and an electric arc event and locate at least one of the short circuit and the electric arc event on the respective conductor.

15. A method of remotely detecting at least one fault in a power system comprising:

configuring a processing element that controls input current through at least one switch to at least one load via at least one conductor, wherein the configuring is based upon at least one characteristic selected from a group consisting of a current rating of each load, a voltage rating of each load, a maximum current rating of each switch and a temperature rating of each switch;

operating each switch in an off mode wherein each switch prevents the input current from flowing to a respective load;

testing the at least one conductor to thereby detect at least one fault in the at least one conductor;

operating each switch in an on mode wherein each switch permits the input current to flow to a respective load when no damaged conductors are detected, and thereafter controlling the input current to the at least one load, wherein controlling the input current comprises:

monitoring at least one parameter associated with each switch and respective load selected from a group consisting of the input current to the load, a voltage drop across the load, the input current through the switch and a temperature of the switch;

determining a condition of each switch and respective load depending upon at least one of the at least one characteristic and the at least one parameter;

monitoring the at least one conductor to thereby detect at least one fault in the at least one conductor; and operating each switch in at least one mode selected from a group consisting of the on mode and the off mode depending upon the condition of the respective loads and at least one fault in the at least one conductor.

16. A method according to claim 15, wherein testing the at least one conductor comprises:

transmitting at least one test pulse down at least one respective conductor and receiving at least one reflection from the at least one respective conductor; and comparing the at least one reflection to reference data to thereby at least one of detect and locate at least one damaged conductor.

17. A method according to claim 16, wherein testing the at least one conductor further comprises converting the at least one reflection to digital data representative of the at least one reflection, and wherein comparing the at least one reflection to reference data comprises comparing the digital data to the reference data.

18. A method according to claim 17, wherein converting the at least one reflection comprises converting the at least one reflection to digital data with at least one resolution.

19. A method according to claim 16, wherein testing the at least one conductor further comprises determining at least one length of the at least one conductor based upon at least one transit time between transmission of the at least one test pulse and reception of the respective at least one reflection, wherein comparing the at least one reflection to reference data comprises comparing the at least one determined length to at least one reference length.

20. A method according to claim 19, wherein comparing the at least one determined length to the at least one reference length comprises detecting at least one damaged conductor when the at least one determined length is shorter than the respective at least one reference length by more than a threshold length, and wherein locating the at least one damaged conductor comprises locating a point on the respective at least one conductor at the at least one determined length.

21. A method according to claim 15, wherein monitoring the at least one conductor to thereby detect at least one fault comprises monitoring the at least one conductor to thereby detect an electric arc event by detecting at least one of white noise and chaotic behavior in current through the at least one conductor to the at least one load.

22. A method according to claim 21, wherein detecting white noise comprises detecting a spectrally dense current through the at least one conductor to the at least one load.

23. A method according to claim 21, wherein operating each switch comprises operating at least one switch in the off mode when an electric arc event is detected on at least one conductor, and wherein the method further comprises testing the at least one conductor after operating the at least one switch in the off mode to thereby at least one of verify the electric arc event and locate the electric arc event on the respective at least one conductor.

24. A method according to claim 15, wherein monitoring the at least one conductor to thereby detect at least one fault comprises monitoring the at least one conductor to thereby detect at least one abnormal current representative of at least one of a short circuit and an electric arc event.

25. A method according to claim 24, wherein each conductor comprises a pair of conductors, and wherein monitoring each of the at least one conductor comprises:

receiving a measurement representative of a current difference in the pair of conductors; and comparing the measurement to a predefined threshold, wherein an abnormal current is detected when the measurement is greater than the predefined threshold.

26. A method according to claim 24, wherein operating each switch comprises operating at least one switch in the off mode when at least one abnormal current representative of at least one of a short circuit and an electric arc event is detected on at least one conductor, and wherein the method further comprises testing the at least one conductor after operating the at least one switch in the off mode to thereby at least one of verify the at least one abnormal current representative of at least one of a short circuit and an electric arc event and locate at least one of the short circuit and the electric arc event on the respective at least one conductor.

* * * * *